United States Patent
Yu (10) Patent No.: US 8,896,057 B1
(45) Date of Patent: Nov. 25, 2014

(54) SEMICONDUCTOR STRUCTURE AND METHOD FOR MANUFACTURING THE SAME

(71) Applicant: United Microelectronics Corp., Hsinchu (TW)

(72) Inventor: Kun-Huang Yu, New Taipei (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 13/893,635

(22) Filed: May 14, 2013

(51) Int. Cl.
  *H01L 29/76* (2006.01)
  *H01L 29/40* (2006.01)
  *H01L 29/66* (2006.01)
  *H01L 29/78* (2006.01)

(52) U.S. Cl.
  CPC ........ *H01L 29/404* (2013.01); *H01L 29/66681* (2013.01); *H01L 29/7823* (2013.01); *H01L 29/407* (2013.01)
  USPC ........................................................ 257/329

(58) Field of Classification Search
  CPC .......................... H01L 29/407; H01L 29/7811
  USPC ........................................................ 257/329
  See application file for complete search history.

(56) References Cited

U.S. PATENT DOCUMENTS

| | | |
|---|---|---|
| 4,344,081 A | 8/1982 | Pao |
| 4,396,999 A | 8/1983 | Malaviya |
| 4,893,160 A | 1/1990 | Blanchard |
| 4,918,333 A | 4/1990 | Anderson |
| 4,958,089 A | 9/1990 | Fitzpatrick |
| 5,040,045 A | 8/1991 | McArthur |
| 5,268,589 A | 12/1993 | Dathe |
| 5,296,393 A | 3/1994 | Smayling |
| 5,326,711 A | 7/1994 | Malhi |
| 5,346,835 A | 9/1994 | Malhi |
| 5,430,316 A | 7/1995 | Contiero |
| 5,436,486 A | 7/1995 | Fujishima |
| 5,534,721 A | 7/1996 | Shibib |
| 5,811,850 A | 9/1998 | Smayling |
| 5,950,090 A | 9/1999 | Chen |
| 5,998,301 A | 12/1999 | Pham |
| 6,066,884 A | 5/2000 | Krutsick |
| 6,144,538 A | 11/2000 | Chao |
| 6,165,846 A | 12/2000 | Carns |
| 6,245,689 B1 | 6/2001 | Hao |
| 6,277,675 B1 | 8/2001 | Tung |

(Continued)

OTHER PUBLICATIONS

United States Patent Office, "Office Action", Aug. 9, 2013.

*Primary Examiner* — Zandra Smith
*Assistant Examiner* — Paul Patton
(74) *Attorney, Agent, or Firm* — WPAT, PC; Justin King (57) ABSTRACT

A semiconductor structure comprises a substrate having a first conductive type; a deep well having a second conductive type formed in the substrate and extending down from a surface of the substrate; a first well and a second well respectively having the first and second conductive types formed in the deep well, and extending down from the surface of the substrate; a gate electrode formed on the substrate and disposed between the first and second wells; an isolation extending down from the surface of the substrate and disposed between the gate electrode and the second well; a conductive plug including a first portion and a second portion electrically connected to each other, and the first portion electrically connected to the gate electrode, and the second portion comprising at least two fingers penetrating into the isolation, and the fingers spaced apart and electrically connected to each other.

18 Claims, 5 Drawing Sheets

(56) References Cited

U.S. PATENT DOCUMENTS

| | | |
|---|---|---|
| 6,277,757 B1 | 8/2001 | Lin |
| 6,297,108 B1 | 10/2001 | Chu |
| 6,306,700 B1 | 10/2001 | Yang |
| 6,326,283 B1 | 12/2001 | Liang |
| 6,353,247 B1 | 3/2002 | Pan |
| 6,388,292 B1 | 5/2002 | Lin |
| 6,400,003 B1 | 6/2002 | Huang |
| 6,424,005 B1 | 7/2002 | Tsai |
| 6,514,830 B1 | 2/2003 | Fang |
| 6,521,538 B2 | 2/2003 | Soga |
| 6,614,089 B2 | 9/2003 | Nakamura |
| 6,713,794 B2 | 3/2004 | Suzuki |
| 6,762,098 B2 | 7/2004 | Hshieh |
| 6,764,890 B1 | 7/2004 | Xu |
| 6,784,060 B2 | 8/2004 | Ryoo |
| 6,784,490 B1 | 8/2004 | Inoue |
| 6,819,184 B2 | 11/2004 | Pengelly |
| 6,822,296 B2 | 11/2004 | Wang |
| 6,825,531 B1 | 11/2004 | Mallikarjunaswamy |
| 6,846,729 B2 | 1/2005 | Andoh |
| 6,855,581 B2 | 2/2005 | Roh |
| 6,869,848 B2 | 3/2005 | Kwak |
| 6,894,349 B2 | 5/2005 | Beasom |
| 6,958,515 B2 | 10/2005 | Hower |
| 7,015,116 B1 | 3/2006 | Lo |
| 7,023,050 B2 | 4/2006 | Salama |
| 7,037,788 B2 | 5/2006 | Ito |
| 7,075,575 B2 | 7/2006 | Hynecek |
| 7,091,079 B2 | 8/2006 | Chen |
| 7,148,540 B2 | 12/2006 | Shibib |
| 7,214,591 B2 | 5/2007 | Hsu |
| 7,309,636 B2 | 12/2007 | Chen |
| 7,323,740 B2 | 1/2008 | Park |
| 7,358,567 B2 | 4/2008 | Hsu |
| 7,427,552 B2 | 9/2008 | Jin |
| 2003/0022460 A1 | 1/2003 | Park |
| 2003/0047777 A1* | 3/2003 | In't Zandt et al. ............ 257/329 |
| 2004/0018698 A1 | 1/2004 | Schmidt |
| 2004/0070050 A1 | 4/2004 | Chi |
| 2005/0227448 A1 | 10/2005 | Chen |
| 2005/0258496 A1 | 11/2005 | Tsuchiko |
| 2006/0035437 A1 | 2/2006 | Mitsuhira |
| 2006/0197149 A1* | 9/2006 | Fujimoto ..................... 257/335 |
| 2006/0261407 A1 | 11/2006 | Blanchard |
| 2006/0270134 A1 | 11/2006 | Lee |
| 2006/0270171 A1 | 11/2006 | Chen |
| 2007/0041227 A1 | 2/2007 | Hall |
| 2007/0082440 A1 | 4/2007 | Shiratake |
| 2007/0132033 A1 | 6/2007 | Wu |
| 2007/0273001 A1 | 11/2007 | Chen |
| 2008/0160697 A1 | 7/2008 | Kao |
| 2008/0160706 A1 | 7/2008 | Jung |
| 2008/0185629 A1 | 8/2008 | Nakano |
| 2008/0296655 A1 | 12/2008 | Lin |
| 2009/0108348 A1 | 4/2009 | Yang |
| 2009/0111252 A1 | 4/2009 | Huang |
| 2009/0159966 A1 | 6/2009 | Huang |
| 2009/0242981 A1 | 10/2009 | Fujita et al. |
| 2009/0278208 A1 | 11/2009 | Chang |
| 2009/0294865 A1 | 12/2009 | Tang |
| 2010/0006937 A1 | 1/2010 | Lee |
| 2010/0032758 A1 | 2/2010 | Wang |
| 2010/0096702 A1 | 4/2010 | Chen |
| 2010/0148250 A1 | 6/2010 | Lin |
| 2010/0213517 A1 | 8/2010 | Sonsky |
| 2011/0057263 A1 | 3/2011 | Tang |
| 2013/0075833 A1 | 3/2013 | Liu et al. |

* cited by examiner

SEMICONDUCTOR STRUCTURE AND METHOD FOR MANUFACTURING THE SAME

BACKGROUND

1. Technical Field

The disclosure relates in general to a semiconductor structure and a method for manufacturing the same, and more particularly to a semiconductor structure having conductive plug with at least two fingers penetrating into the isolation, which decreases the on-resistance (Ron) and increases the breakdown voltage of the semiconductor structure simultaneously, thereby improving the ratio of Ron to breakdown voltage (Ron/BVD).

2. Description of the Related Art

Reduction of feature size, improvements of the rate, the efficiency, the density and the cost per integrated circuit unit are the important goals in the semiconductor technology. With the development of semiconductor technology, high power devices have been applied to a variety of electronic products in different fields. Laterally diffused metal oxide semiconductor (LDMOS) or extended drain metal oxide semiconductor (EDMOS) is widely used in high voltage or high power PMIC (power management integrated circuit) application as the driving device.

On-resistance (Ron) is one of key factors of the semiconductor device. The lower the on-resistance or the specific on-resistance (Ron-sp), the lower the power consumption of the semiconductor device. Ron is a very important characteristic for the PMIC products, especially for the portable IC devices. Many improvements have been disclosed by modifying the structures of LDMOS or EDMOS devices; for example, changing the shape of STI or wells. However, Ron improvement is still limited on current LDMOS or EDMOS devices. No more than about 5% of improvement on the ratio of Ron to breakdown voltage (Ron/BVD) has been achieved by using well scheme or implant optimization.

SUMMARY

The disclosure is directed to a semiconductor structure and a method for manufacturing the same, particularly directed to a semiconductor structure having a conductive plug with at least two fingers penetrating into the isolation, which decreases the on-resistance (Ron) and increases the breakdown voltage of the semiconductor structure simultaneously, thereby improving the ratio of the Ron to the breakdown voltage (Ron/BVD). The characteristic of the device applied with the semiconductor structure of the disclosure is enhanced consequently.

According to the embodiment, a semiconductor structure comprises a substrate having a first conductive type; a deep well having a second conductive type formed in the substrate and extending down from a surface of the substrate; a first well having the first conductive type formed in the deep well and extending down from the surface of the substrate; and a second well having the second conductive type formed in the deep well and extending down from the surface of the substrate, and the second well spaced apart from the first well; a gate electrode formed on the substrate and disposed between the first and second wells; an isolation extending down from the surface of the substrate and disposed between the gate electrode and the second well; a conductive plug including a first portion and a second portion electrically connected to each other, and the first portion electrically connected to the gate electrode, and the second portion comprising at least two fingers penetrating into the isolation, and the fingers spaced apart and electrically connected to each other.

According to another aspect of the disclosure, a method of manufacturing semiconductor structure is provided, comprising steps of providing a substrate having a first conductive type; forming a deep well having a second conductive type in the substrate and extending down from a surface of the substrate; forming a first well having the first conductive type in the deep well and extending down from the surface of the substrate; forming a second well having the second conductive type in the deep well, the second well extending down from the surface of the substrate and spaced apart from the first well; forming an isolation extending down from the surface of the substrate and part of the isolation disposed in the second well; forming a gate electrode on the substrate and disposed between the first and second wells; and forming a conductive plug comprising a first portion and a second portion electrically connected to each other, the first portion connecting the gate electrode, and the second portion comprising at least two fingers penetrating into the isolation, and the fingers are spaced apart and electrically connected to each other.

DETAILED DESCRIPTION

The embodiments as illustrated below provide semiconductor structures having conductive plugs comprising at least two fingers and methods of manufacturing the same. The semiconductor structures of the embodiments not only decrease the On-resistance (Ron) but also increase the breakdown voltage (BVD) of the devices, thereby efficiently improving the electrical characteristics of the devices.

The embodiments are described in details with reference to the accompanying drawings. The identical elements of the embodiments are designated with the same reference numerals. Also, it is also important to point out that the illustrations may not be necessarily be drawn to scale, and that there may be other embodiments of the present disclosure which are not specifically illustrated. Thus, the specification and the drawings are to be regard as an illustrative sense rather than a restrictive sense.

Figure 1:
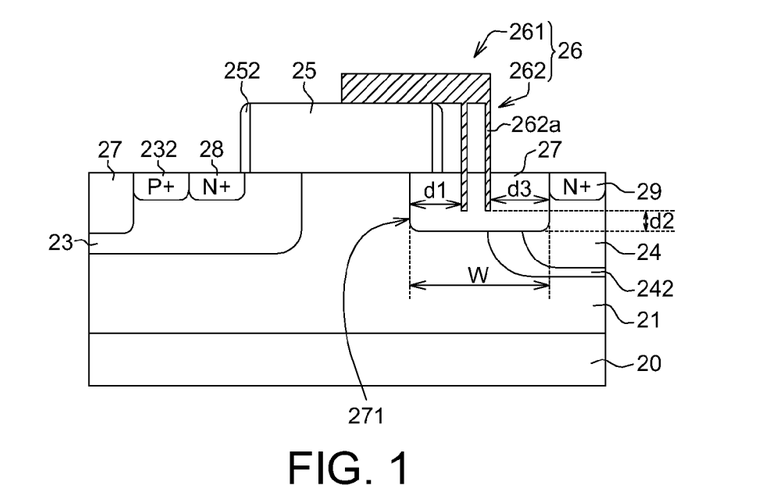
FIG. 1 is a partial drawing of a LDMOS device according to an embodiment of the disclosure.

FIG. 1 is a partial drawing of a LDMOS device according to an embodiment of the disclosure. The LDMOS device 1 of the embodiment includes a substrate 20 having a first conductive type (such as P-type); a deep well 21 having a second conductive type (such as N-type) formed in the substrate 20 and extending down from a surface of the substrate 20; a first well 23 having the first conductive type (such as P-type) extending down from the surface of the substrate 20; a second well 24 having the second conductive type (such as N-type) formed in the deep well 21 by extending down from the surface of the substrate 20, and the second well 24 spaced apart from the first well 23; a gate electrode 25 formed on the substrate 20 and disposed between the first well 23 and the second well 24; an isolation 27, such as an oxide or STI, extending down from the surface of the substrate 20 and substantially disposed between the gate electrode 25 and the second well 24.

The LDMOS device 1 further includes a first doping electrode region 28 having the second conductive type formed within the first well 23 and extending down from the surface of the substrate 20; and a second doping electrode region 29 having the second conductive type formed within the second well 24 and extending down from the surface of the substrate 20. The isolation 27 is disposed between the gate electrode 25 and the second doping electrode region 29. The first doping electrode region 28 and the second doping electrode region 29 function as the source and the drain of the device, respectively. Accordingly, the gate electrode 25 and the drain (i.e. the second doping electrode region 29) are separated by the isolation 27 (ex: STI). In the embodiment, a third doping region 232 having the first conductive type (ex: P-doping region) is also formed in the first well (ex: P-well) 23 and adjacent to the source (i.e. the first doping electrode region 28) 18 as a bulk.

Also, the LDMOS device 1 might include a field with the second conductive type such as a HVN field 242 around the second well 24. In one embodiment, the second doping electrode region 29, the second well 24, the HVN field 242 and the deep well 21 are implanted in an order from high to low doping concentrations, respectively.

The LDMOS device 1 of the embodiment further includes a conductive plug 26 comprising a first portion 261 and a second portion 262 electrically connected to each other. The first portion 261 is electrically connected to the gate electrode 25, and the second portion 262 comprises at least two fingers 262a penetrating into the isolation 27. In other words, the second portion 262 of the conductive plug 26 comprises n of fingers, n is an integer, and n≥2. As shown in FIG. 1, the fingers 262a are spaced apart and electrically connected to each other. The fingers 262a of the conductive plug 26 could be spaced apart from each other at the same distance, or at the different distances.

Also, the first portion 261 of the conductive plug 26 is disposed on the gate electrode 25 to contact the gate electrode 25, as shown in FIG. 1. The first portion 261 and the fingers 262a of the second portion 262 could be formed as one integrated piece.

Practically, the conductive plug 26 could be a tungsten plug, or a plug made of other conductive materials. No extra mask and photolithography step are required to manufacture the semiconductor structure of the embodiment. Configuration of the conductive plug 26 connected to the gate electrode 25 could be achieved at the contact formation process (by photo and etching steps) simultaneously.

As shown in FIG. 1, one of the fingers 262a of the second portion 262 closest to the first side wall 271 of the isolation 27 near the gate electrode 25 is spaced apart from the first side wall 271 of the isolation 27 at a first distance, which is denoted as d1. A width of the isolation (ex: STI) 27 is denoted as W. Practically, the width of the isolation 27 is tunable for different BVD requirement (ex: 30, 40, 50V). In one embodiment, the first distance d1 is in a range of about 300 Å to about 800 Å. Also, the fingers 262a of the second portion 262 is spaced apart from a bottom surface of the isolation 27 at a second distance d2. In one embodiment, the second distance d2 is in a range of about 0.05 μm to about 0.15 μm; the ratio of the depth of the fingers 262a to the depth of the isolation 27 is in a range of about 0.4 to about 0.9. Also, the finger 262a of the second portion 262 farthest from the gate electrode 25 is spaced apart from the second doping electrode region 29 at a third distance d3. In one embodiment, the third distance d3 is in a range of about 1 μm to about 4 μm. However, the disclosure is not limited to those numerical ranges. The actual sizes of components in the conductive plug 26, such as the first distance d1, the second distance d2, the third distance d3, etc., could be adjusted according to the size of the device in practical applications, such as bottom width of the isolation 27 and the insertion depth of the fingers 262a of the conductive plug 26.

Moreover, the isolation 27 of the embodiment could be a single layer or a combination of multi-layers including several insulating layers. The combination of multi-layers of the isolation 27 could be selected from $SiO_2$, SiON, $Si_3N_4$, and materials with high dielectric constant. For example, the isolation 27 is a combination of the $SiO_2$ layer and the $Si_3N_4$ layer, which the $Si_3N_4$ layer functions as an etch stop layer and facilitates controlling the second distance d2 precisely. Examples of materials with high dielectric constant include rare-earth (RE) oxides and lanthanide series metal oxides.

Furthermore, the gate electrode 25 could be extended toward the second well 24 and partially overlapped with the isolation 27, as shown in FIG. 1. However, the disclosure is not limited thereto. The gate electrode 25 could be substantially aligned with the first side wall 271 of the isolation 27, as shown in FIG. 2.

Figure 2:
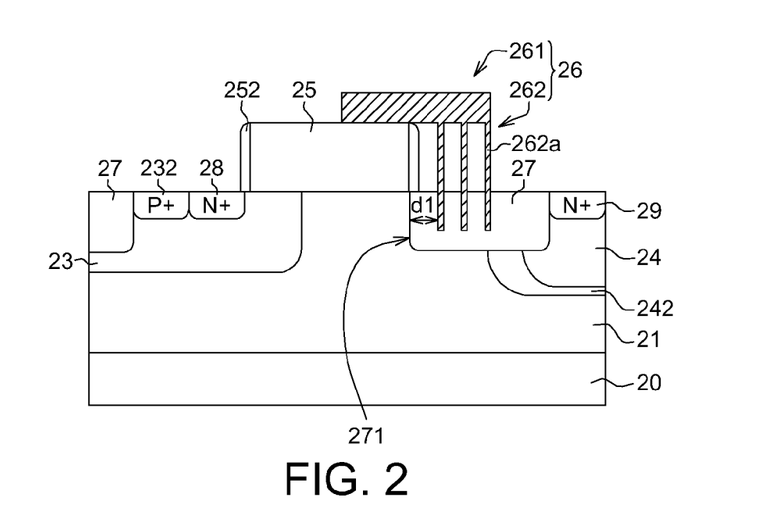
FIG. 2 is a partial drawing of a LDMOS device according to another embodiment of the disclosure.

FIG. 2 is a partial drawing of a LDMOS device according to another embodiment of the disclosure. Structures of the LDMOS device 2 of FIG. 2 and the LDMOS device 1 of FIG. 1 are identical except for the position of the gate electrode 25 and the number of the fingers 262a. As shown in the LDMOS device 2 of FIG. 2, the second portion 262 of the conductive plug 26 of the LDMOS device 3 includes three fingers 262a, and a first side wall 271 of the isolation 27 is disposed beneath the gate electrode 25, and part of the isolation 27 is disposed in the second well 24. Other details of the conductive plug 26 in FIG. 2 could be referred to the descriptions above, and are not redundantly described.

Figure 3A:
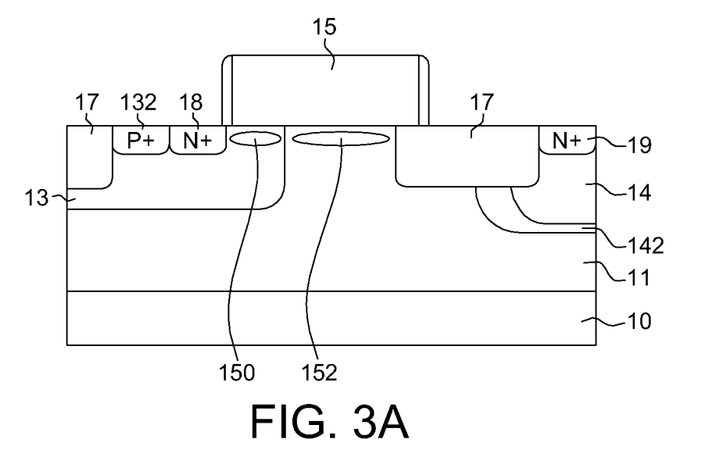
FIG. 3A and FIG. 3B illustrate the current paths of a LDMOS device without conductive plug and the LDMOS device of FIG. 1 of the embodiments during operation, respectively.
Figure 3B:
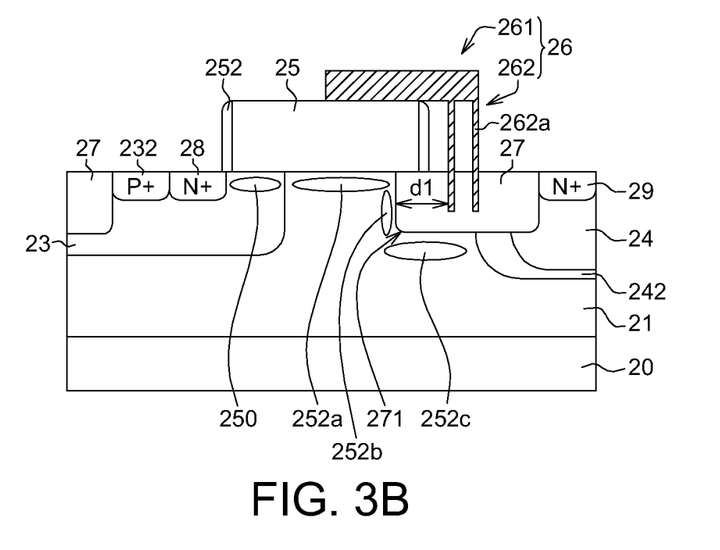

FIG. 3A and FIG. 3B illustrate the current paths of a LDMOS device without conductive plug and the LDMOS device of FIG. 1 of the embodiments during operation, respectively. The elements of FIG. 3B and FIG. 1 are designated with the same reference numerals. A typical LDMOS device of FIG. 3A comprises a P-substrate 10, a N-deep well (NDW) 11, a P-well 13 and a N-well 14 formed in the N-deep well 11 by a distance, a gate electrode 15 formed on the P-substrate 10 and substantially between the P-well 13 and the N-well 14, an isolation 17 (such as shallow trench isolation, STI) substantially between the gate electrode 15 and the N-well 14, two heavy N-doping regions respectively formed in the P-well 13 and the N-well 14 for being the source 18 and the drain 19. Also, a P-doping region 132 is formed in the P-well 13 and adjacent to the source 18 as a bulk.

In FIG. 3A, the typical LDMOS device without conductive plug includes a channel area 150 and a charge-accumulation area 152. If a positive bias is applied to the gate electrode 15, the negative charges accumulate in the charge-accumulation area 152. In FIG. 3B, the LDMOS device of the embodiment includes a channel area 250 and the charge-accumulation areas 252a, 252b and 252c. Compared to the LDMOS device of FIG. 3A, the charge-accumulation areas 252a-252c of the LDMOS device of the embodiment of FIG. 3B is longer due to the existence of the conductive plug 26 (i.e. the first portion 261 and the fingers 262a of the second portion 262). If a positive bias is applied to the gate electrode 25 of the embodiment, the negative charges are distributed in the longer charge-accumulation areas 252a-252c and more close to drain side area, thereby reducing the resistance in the extended drain area. Accordingly, the on-resistance of the LDMOS device of the embodiment (as shown in FIG. 1) has been efficiently decreased, especially at the condition of low drain bias operation.

Figure 4A:
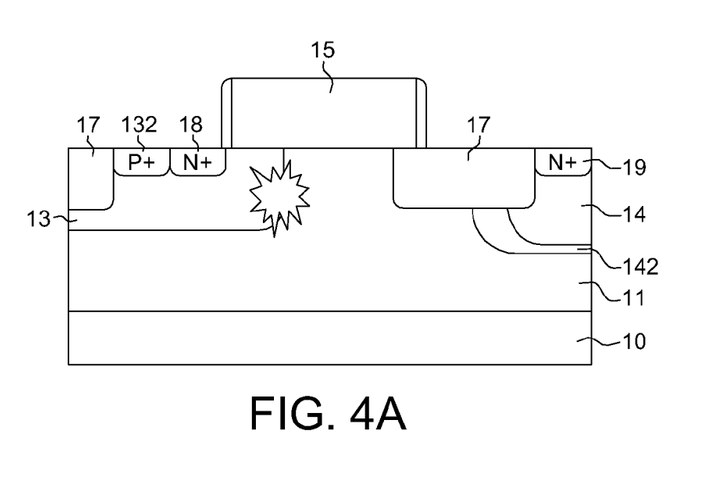
FIG. 4A and FIG. 4B respectively illustrate the breakdown occurrence of the typical LDMOS device and the LDMOS device of FIG. 1 of the embodiments during operation.
Figure 4B:
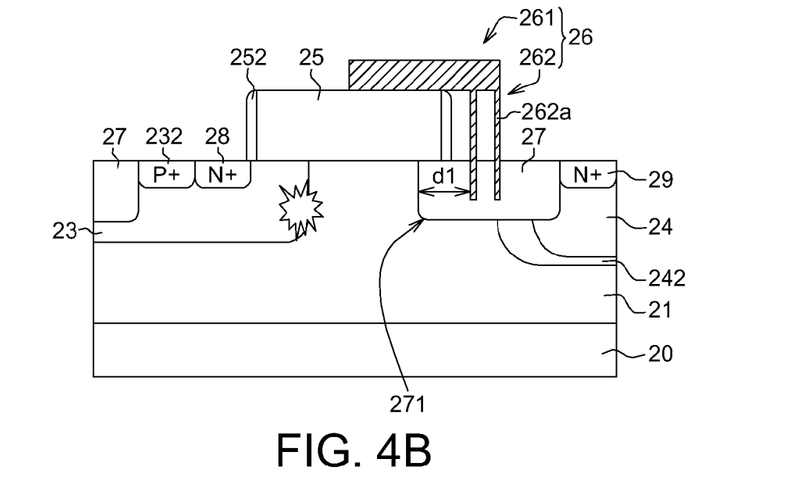

FIG. 4A and FIG. 4B respectively illustrate the breakdown occurrence of the typical LDMOS device and the LDMOS device of FIG. 1 of the embodiments during operation. The elements of FIG. 4A and FIG. 3A are designated with the same reference numerals. The elements of FIG. 4B and FIG. 1 are designated with the same reference numerals. Breakdown will occur in lightly doped PN junctions, such as the boundaries between the P-type second wells 13, 23 and the N-type deep wells 11, 21 (i.e., positions of star symbols depicted in FIG. 4A and FIG. 4B). The critical value of the voltage, at which the breakdown of a P-N junction diode occurs, is called the breakdown voltage. Since the LDMOS device of FIG. 1 has the conductive plug 26 with fingers 262a as shown in FIG. 4B, the fingers 262a of the second portion 262 function as the shielding plates, resulting in the re-distribution of the lines of electric force between the drain (i.e. the second doping electrode region 29) and the second well 23. Compared to the typical LDMOS device of FIG. 4A, the lines of electric force close to the PN junctions at which the breakdown occurs in FIG. 4B are not as dense as that in FIG. 4A, and the breakdown voltage of the device is decreased due to the change of the electric field.

Figure 5A:
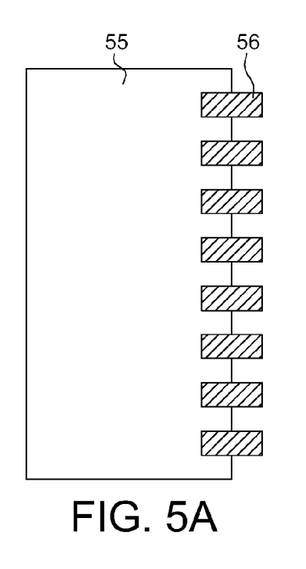
FIG. 5A, FIG. 5B and FIG. 5C simply illustrate the top views of three different types of the configurations of the conductive plug and gate electrode of the LDMOS devices according to the embodiments of the disclosure.
Figure 5B:
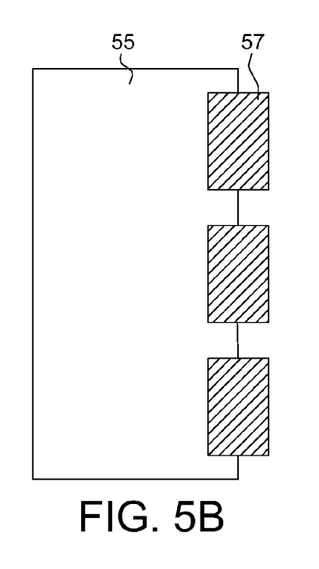
Figure 5C:
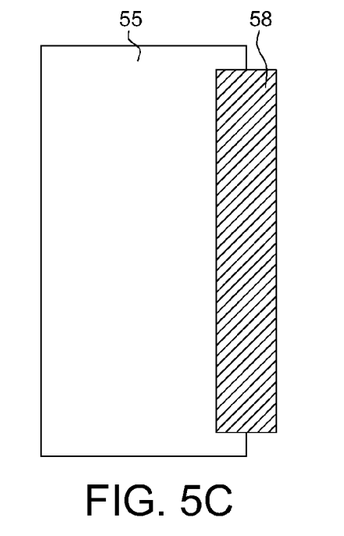
Figure 6A:
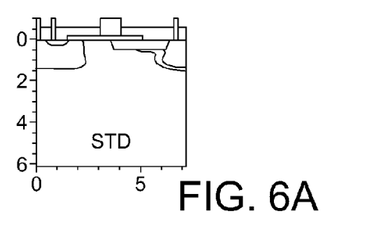
FIG. 6A~FIG. 6I are the simulation drawings depicting the exemplary devices STD and Split 1~Split 8 in the experiments.
Figure 6B:
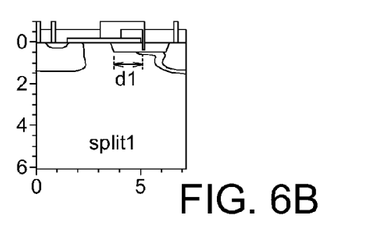
Figure 6C:
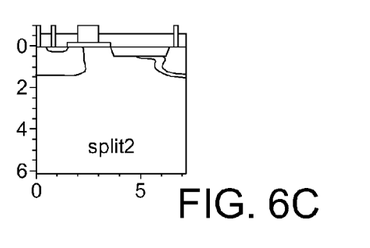
Figure 6D:
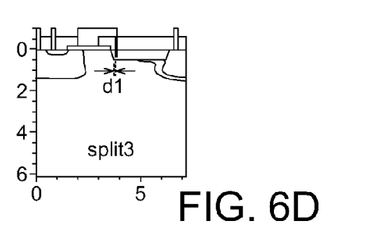
Figure 6E:
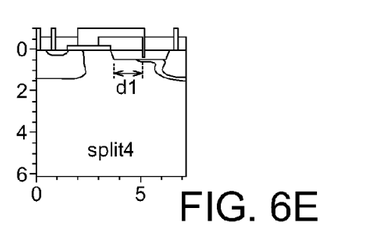
Figure 6F:
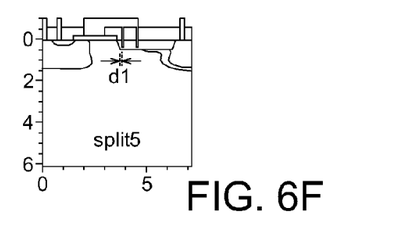
Figure 6G:
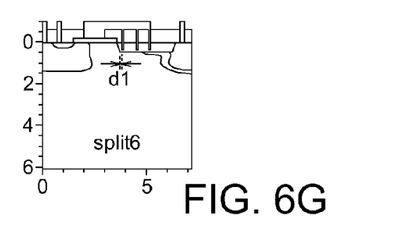
Figure 6H:
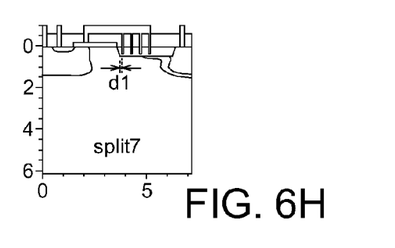
Figure 6I:
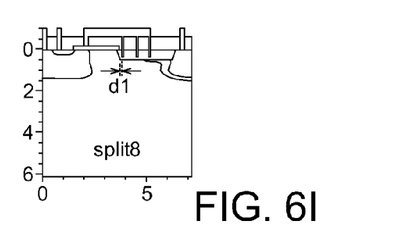

Additionally, configuration of the conductive plug 26 and gate electrode 25 could be varied depending on the actual needs of the applications. FIG. 5A, FIG. 5B and FIG. 5C simply illustrate the top views of three different types of the configurations of the conductive plug and gate electrode of the LDMOS devices according to the embodiments of the disclosure. As shown in FIG. 5A, the conductive plug could be configured as a pattern of dots 56 (ex: square shaped, rectangular, circular or the likes) separately formed on the gate electrode 55. As shown in FIG. 5B, the conductive plug could be configured as a pattern of rectangular blocks 57 separately formed on the gate electrode 55. As shown in FIG. 5C, the conductive plug could be configured as a long strip 58 formed on the gate electrode 55. It is, of course, noted that the configurations of FIG. 5A-FIG. 5C are depicted only for demonstration, not for limitation. It is known by people skilled in the art that the shapes of the top surface of the conductive plug and the area ratio of the conductive plug to the gate electrode could be adjusted according to the requirements and/or manufacturing method in the practical application.

[Relative Experiments]

In the relative experiments, the characteristics of semiconductor structure would be affected by the number of the fingers of the second portion 262 inserting the isolation 27. Two, three or more fingers 262a of the second portion 262 inserting the isolation 27 would cause the significant effect on the Ron/BVD improvement. Also, the first distance d1 between the finger 262a of the second portion 262 and the first side wall 271 of the isolation 27 has effects on not only the on-resistance but also the breakdown voltage of the device. The closer the finger 262a to the first side wall 271 of the isolation 27, the better results of the Ron/BVD ratio.

Exemplary devices Split 1~Split 8 are provided for conducting related simulations, and the results of measurements are listed in Table 1. Please also refer FIG. 1 and FIG. 2 for the structures of exemplary devices having the conductive plugs. The exemplary devices Split 5~Split 8 are constructed as the device of the embodiment, and the exemplary devices Split 1~Split 4 are constructed for comparison. FIG. 6A~FIG. 6I are the simulation drawings depicting the exemplary devices STD and Split 1~Split 8 in the experiments. The first distance d1 between the finger 262a of the second portion 262 and the first side wall 271 of the isolation 27 is also labeled in FIG. 6B, FIG. 6D~FIG. 6I. In the simulation, the width of the STI (i.e. isolation 27 of FIG. 1/FIG. 2) is 2.8 μm. Other conditions of the exemplary devices STD and Split 1~Split 8 are briefly described below.

STD (FIG. 6A): a device without conductive plug, and the gate electrode extends and partially overlapped the STI.

Split 1 (FIG. 6B): a device with a conductive plug comprising one finger penetrating into the STI, and the gate electrode extends and partially overlapped the STI. The first distance d1 is 1.55 μm.

Split 2 (FIG. 6C): a device without conductive plug, and the gate electrode substantially aligned with the STI.

Split 3 (FIG. 6D): a device with a conductive plug comprising one finger penetrating into the STI, and the gate electrode substantially aligned with the STI. The finger is close to the first sidewall 271 of the isolation 27. The first distance d1 is 0.21 μm.

Split 4 (FIG. 6E): a device with a conductive plug comprising one finger penetrating into the STI, and the gate electrode substantially aligned with the STI. The finger is distanced from the first sidewall 271 of the isolation 27. The first distance d1 is 1.51 μm.

Split 5 (FIG. 6F): a device with a conductive plug comprising two fingers penetrating into the STI according to the embodiment, and the gate electrode substantially aligned with the STI. The first distance d1 is 0.21 μm.

Split 6 (FIG. 6G): a device with a conductive plug comprising three fingers penetrating into the STI according to the embodiment, and the gate electrode substantially aligned with the STI. The first distance d1 is 0.21 μm.

Split 7 (FIG. 6H): a device with a conductive plug comprising four fingers penetrating into the STI according to the embodiment, and the gate electrode substantially aligned with the STI. The first distance d1 is 0.21 μm.

Split 8 (FIG. 6I): a device with a conductive plug comprising three fingers penetrating into the STI according to the embodiment, and the gate electrode extends and slightly overlapped the STI for 0.2 μm. The first distance d1 is 0.27 μm.

The measurement results of the Ron, the BVD, and the Ron/BVD of the exemplary devices are listed in Table 1.

The results of the experiments have shown that the semiconductor structure of the embodiment do decrease the on-resistance (Ron) and increase the breakdown voltage simultaneously, and the ratio of Ron to breakdown voltage (Ron/BVD) is also improved greatly. The breakdown voltages of four exemplary devices (Split 5-Split 8) are 56V, 57V, 58V and 59V, respectively. The specific on-resistances (Ron-sp, mohm×mm$^2$) of four exemplary devices (Split 5-Split 8) are 52.31, 51.78, 52.70 and 52.88, respectively. The ratios of specific on-resistance to breakdown voltage (Ron-sp/BVD) of four exemplary devices (Split 5-Split 8) are 0.93, 0.91, 0.91 and 0.89, respectively. Ratios of Ron-sp/BVD of four exemplary devices (Split 5-Split 8) have been increased up to 24%, 26%, 27% and 28%, respectively.

TABLE 1

| Device | Structure | d1 | BVD (V) | Ron-sp (mohm × mm²) | Ron-sp/ BVD | Ron-sp/BVD Improvement (%) |
|---|---|---|---|---|---|---|
| STD | — | NA | 46 | 56.84 | 1.24 | NA |
| Split 1 | Gate W-plug | 1.55 μm | 49 | 56.50 | 1.15 | 7% |
| Split 2 | Poly align STI | NA | 38 | 59.27 | 1.56 | −26% |
| Split 3 | Poly align STI-W-plug | 0.21 μm | 48 | 53.53 | 1.12 | 10% |
| Split 4 | Poly align STI-W-plug | 1.51 μm | 42 | 58.08 | 1.38 | −12% |
| Split 5 | Finger W-plug 1 | 0.21 μm | 56 | 52.31 | 0.93 | 24% |
| Split 6 | Finger W-plug 2 | 0.21 μm | 57 | 51.78 | 0.91 | 26% |
| Split 7 | Finger W-plug 3 | 0.21 μm | 58 | 52.70 | 0.91 | 27% |
| Split 8 | Poly over STI-W-plug | 0.27 μm | 59 | 52.88 | 0.89 | 28% |

Accordingly, the semiconductor structure of the embodiments having conductive plug comprising at least two fingers penetrating the isolation not only decreases the on-resistance but also increase the breakdown voltage of the semiconductor structure. The simulation results have shown that the ratio of Ron/BVD is significantly decreased. For PMIC (power management integrated circuit) application, especially for the portable IC devices, the characteristic and performance of the products applied with the structure of the embodiment have been greatly improved. Moreover, the structure of the embodiment could be implemented without changing the device pitch and the manufacturing method thereof is compatible with current process. Therefore, the structure of the embodiment is feasible for mass production. Also, the devices applied with the structure of the embodiment possess high competitiveness in the commercial market.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor structure, comprising:
    a substrate having a first conductive type;
    a deep well having a second conductive type, formed in the substrate and extending down from a surface of the substrate;
    a first well having the first conductive type, extending down from the surface of the substrate and formed in the deep well;
    a second well having the second conductive type, extending down from the surface of the substrate and formed in the deep well, and the second well spaced apart from the first well;
    a gate electrode, formed on the substrate and disposed between the first and second wells;
    an isolation, extending down from the surface of the substrate and substantially disposed between the gate electrode and the second well;
    a conductive plug, comprising:
        a first portion connecting the gate electrode; and
        a second portion comprising at least two fingers penetrating into the isolation, and the second portion electrically connected to the first portion, and the fingers spaced apart and electrically connected to each other;
    a first doping electrode region having the second conductive type, extending down from the surface of the substrate and formed within the first well; and
    a second doping electrode region having the second conductive type, extending down from the surface of the substrate and formed within the second well; wherein the fingers are disposed between the first doping electrode region and the second doping electrode region.

2. The semiconductor structure according to claim 1, wherein one of the fingers closest to a first side wall of the isolation near the gate electrode is spaced apart from the first side wall of the isolation at a first distance.

3. The semiconductor structure according to claim 2, wherein the first distance is in a range of about 300 Å to about 800 Å.

4. The semiconductor structure according to claim 1, wherein the fingers of the second portion of the conductive plug are spaced apart from a bottom surface of the isolation at a second distance.

5. The semiconductor structure according to claim 4, wherein the second distance is in a range of about 0.05 μm to about 0.15 μm.

6. The semiconductor structure according to claim 1, wherein the gate electrode is extended toward to the second well and partially overlapped with the isolation.

7. The semiconductor structure according to claim 1, wherein the gate electrode is substantially aligned with a first side wall of the isolation.

8. The semiconductor structure according to claim 1, wherein the isolation is disposed between the gate electrode and the second doping electrode region.

9. The semiconductor structure according to claim 1, wherein the first portion of the conductive plug is disposed on the gate electrode and contacts the gate electrode.

10. The semiconductor structure according to claim 1, wherein the isolation is a single layer or a combination of multi-layers.

11. The semiconductor structure according to claim 10, wherein the isolation is a shallow trench isolation (STI) or an oxide.

12. The semiconductor structure according to claim 10, wherein the isolation comprises multi-layers selected from $SiO_2$, $SiON$, $Si_3N_4$, and materials with high dielectric constant.

13. A method of manufacturing a semiconductor structure, comprising:
    providing a substrate having a first conductive type;
    forming a deep well having a second conductive type in the substrate and extending down from a surface of the substrate;
    forming a first well having the first conductive type in the deep well and extending down from the surface of the substrate;
    forming a second well having the second conductive type in the deep well, the second well extending down from the surface of the substrate and spaced apart from the first well;
    forming an isolation extending down from the surface of the substrate and part of the isolation disposed in the second well;
    forming a gate electrode on the substrate and disposed between the first and second wells; and forming a conductive plug comprising a first portion and a second portion electrically connected to each other, the first portion connecting the gate electrode, and the second portion comprising at least two fingers penetrating into the isolation, and the fingers are spaced apart and electrically connected to each other;

forming a first doping electrode region having the second conductive type within the first well and extending down from the surface of the substrate; and forming a second doping electrode region having the second conductive type within the second well and extending down from the surface of the substrate, so as to dispose the fingers between the first doping electrode region and the second doping electrode region.

14. The method according to claim 13, wherein the gate electrode is extended toward to the second well and partially overlapped with the isolation.

15. The method according to claim 13, wherein the gate electrode is substantially aligned with a first side wall of the isolation.

16. The method according to claim 13, wherein the first portion and the second portion of the conductive plug are formed as one integrated piece.

17. The method according to claim 16, wherein the isolation is disposed between the gate electrode and the second doping electrode region.

18. The method according to claim 13, wherein the first portion of the conductive plug is disposed on the gate electrode and contacts the gate electrode.

\* \* \* \* \*